(12) United States Patent
Chen et al.

(10) Patent No.: US 7,715,267 B2
(45) Date of Patent: May 11, 2010

(54) DRIVING METHOD AND DRIVING CIRCUIT AND LOW POWER MEMORY USING THE SAME

(75) Inventors: Chung-Kuang Chen, Taipei (TW); Chun-Hsiung Hung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 26 days.

(21) Appl. No.: 11/826,746

(22) Filed: Jul. 18, 2007

(65) Prior Publication Data

US 2009/0022004 A1  Jan. 22, 2009

(51) Int. Cl.
*G11C 5/14* (2006.01)
(52) U.S. Cl. ............... 365/227; 365/185.23; 365/183; 365/189.02; 365/230.02; 365/230.06
(58) Field of Classification Search ............. 365/227, 365/185.23, 183, 189.02, 189.03, 189.15, 365/189.16, 189.11, 230.02, 230.06, 230.08
See application file for complete search history.

(56) References Cited

U.S. PATENT DOCUMENTS

2005/0219903 A1* 10/2005 Daga ............... 365/185.18
2006/0181955 A1*  8/2006 Shinozaki et al. ....... 365/230.06

* cited by examiner

*Primary Examiner*—Hoai V Ho
*Assistant Examiner*—Fernando N Hidalgo
(74) *Attorney, Agent, or Firm*—Bacon & Thomas, PLLC

(57) ABSTRACT

A driving circuit includes a first switch, a first driver and a second driver. The first switch has a first terminal coupled to a first voltage. The first driver includes a second switch and a third switch. The second switch has a first terminal coupled to a second terminal of the first switch, and a second terminal coupled to a first capacitor. The third switch has a first terminal coupled to the second terminal of the second switch, and a second terminal coupled to a second voltage. The second driver includes a fourth switch and a fifth switch. The fourth switch has a first terminal coupled to the second terminal of the first switch, and a second terminal coupled to a second capacitor. The fifth switch has a first terminal coupled to the second terminal of the fourth switch, and a second terminal coupled to the second voltage.

31 Claims, 10 Drawing Sheets

DRIVING METHOD AND DRIVING CIRCUIT AND LOW POWER MEMORY USING THE SAME

BACKGROUND OF THE INVENTION

1. Field of the Invention

The invention relates in general to a charge recycling method and a driving circuit and a low power memory using the same, and more particularly to a charge recycling method capable of reducing the power consumption, and a driving circuit and a low power memory using the charge recycling method.

2. Description of the Related Art

FIG. 1A (Prior Art) is a schematic illustration showing a Y pre-decode driving circuit 100 of a conventional memory. Referring to FIG. 1A, the Y pre-decode driving circuit 100 includes a first pre-decode driver 101 and a second pre-decode driver 102. The first pre-decode driver 101 includes a first switch Q1 and a second switch Q2. The second pre-decode driver 102 includes a third switch Q3 and a fourth switch Q4. Each pre-decode driver has to drive several corresponding select transistors (not shown) in a Y multiplexer (YMUX) in a memory, so each output node of pre-decode driver corresponds to a parasitic capacitor, the output node YP1 of the first pre-decode driver 101 corresponds to a first parasitic capacitor CAP1 and the output node YP2 of the second pre-decode driver 102 corresponds to a second parasitic capacitor CAP2. In addition, each select transistor in the YMUX substantially corresponds to one bit line.

The first pre-decode driver 101 is controlled by a first address select signal A1 to drive the corresponding select transistors, and the second pre-decode driver 102 is controlled by a second address select signal A2 to drive the corresponding select transistors. FIG. 1B (Prior Art) shows waveforms of time V.S. voltages of the address select signals A1 and A2, the output nodes YP1 and YP2 and the parasitic capacitors CAP1 and CAP2 of the Y pre-decode driving circuit 100. Before the time instant t, the memory controls the second pre-decode driver 102 through the second address select signal A2, and the second pre-decode driver 102 selects the desired bit line in cooperation with a bit line driver (not shown in FIG. 1A). At this time, the second address select signal A2 turns on the third switch Q3 and turns off the fourth switch Q4, the second parasitic capacitor CAP2 is charged to a designed voltage POWER, the first address select signal A1 turns off the first switch Q1 and turns on the second switch Q2, and the voltage level of the first parasitic capacitor CAP1 is the ground voltage GND.

At the time instant t, the memory wants to select a next bit line. Thus, the memory controls the first pre-decode driver 101 through the first address select signal A1, and the first pre-decode driver 101 selects the desired bit line in cooperation with the bit line driver. At this time, the first address select signal A1 turns on the first switch Q1 and turns off the second switch Q2, and the first parasitic capacitor CAP1 is started to be charged until the voltage thereof reaches the designed voltage POWER. Next, the second address select signal A2 turns off the third switch Q3 and turns on the fourth switch Q4, and the second parasitic capacitor CAP2 starts to discharge until the voltage thereof reaches the ground voltage GND.

In the Y pre-decode driving circuit 100 mentioned hereinabove, the first parasitic capacitor CAP1 is charged by a voltage supply via the first switch Q1. Then, the second parasitic capacitor CAP2 discharges the charges, which flows away through the fourth switch Q4. The charges discharged from the second parasitic capacitor CAP2 cannot be utilized in the process of charging the first parasitic capacitor CAP1, and are thus wasted.

SUMMARY OF THE INVENTION

The invention is directed to a charge recycling method and a driving circuit and a low power memory using the same, wherein drivers are respectively coupled to switches and the charge recycling method is adopted so that charges stored in a capacitor corresponding to the driver may be recycled through a short-circuit loop.

According to a first aspect of the present invention, a charge recycling method is provided. First, a driving circuit is provided. The driving circuit includes a first switch, a first driver and a second driver. The first driver includes a second switch and a third switch. The second driver includes a fourth switch and a fifth switch. The first switch has a first terminal coupled to a first voltage. The second switch and the third switch are connected in series. The fourth switch and the fifth switch are connected in series. A first terminal of the second switch and a first terminal of the fourth switch are coupled to a second terminal of the first switch. A second terminal of the second switch is coupled to a first capacitor. A second terminal of the fourth switch is coupled to a second capacitor. A second terminal of the third switch and a second terminal of the fifth switch are coupled to a second voltage. Next, the first switch, the third switch and the fourth switch are turned on, the second switch and the fifth switch are turned off so that a voltage level of the first capacitor is the second voltage and a voltage level of the second capacitor is the first voltage. Then, the first switch is turned off to isolate the first voltage. Next, the third switch is turned off then the second switch is turned on so that charges stored in one of the first capacitor and the second capacitor flow to the other one of the first capacitor and the second capacitor in a direction from a higher voltage level to a lower voltage level until a voltage level of the second terminal of the second switch is equal to a voltage level of the second terminal of the fourth switch. Then, the fourth switch is turned off and the fifth switch is turned on so that the voltage level of the second capacitor approaches the second voltage. Afterwards, the first switch is turned on so that the voltage level of the first capacitor approaches the first voltage.

According to a second aspect of the present invention, a driving circuit including a first switch, a first driver and a second driver is provided. The first switch has a first terminal coupled to a first voltage. The first driver includes a second switch and a third switch. The second switch has a first terminal coupled to a second terminal of the first switch, and a second terminal coupled to a first capacitor. The third switch has a first terminal coupled to the second terminal of the second switch, and a second terminal coupled to a second voltage. The second driver includes a fourth switch and a fifth switch. The fourth switch has a first terminal coupled to the second terminal of the first switch, and a second terminal coupled to a second capacitor. The fifth switch has a first terminal coupled to the second terminal of the fourth switch, and a second terminal coupled to the second voltage.

According to a third aspect of the present invention, a low power memory including multiple bit lines, a memory cell array, a Y multiplexer, a Y pre-decode driving circuit and a bit line driving unit is provided. The memory cell array is coupled to the bit lines. The Y multiplexer has a plurality of select transistors arranged in an array. First terminals of the select transistors are respectively coupled to the bit lines. The Y pre-decode driving circuit includes a first switch and a plurality of pre-decode drivers. The first switch has a first terminal coupled to a first voltage. Each of the pre-decode drivers is for controlling one row of the select transistors and includes a second switch and a third switch. The second switch has a first terminal coupled to a second terminal of the first switch, and a second terminal coupled to the row of the select transistors. The third switch has a first terminal coupled to the second terminal of the second switch, and a second terminal coupled to a second voltage. The bit line driving unit is coupled to second terminals of the select transistors, and selects a desired one of the bit lines in cooperation with the pre-decode drivers.

According to a fourth aspect of the present invention, a low power memory including multiple word lines and bit lines, a memory cell array, a bit line driving unit, and an X decoder is provided. The memory cell array is coupled to the word lines and the bit lines. The bit line driving unit selects a desired one of the bit lines. The X decoder includes a first switch and a plurality of pre-decode drivers. The first switch has a first terminal coupled to a first voltage. Each of the pre-decode drivers is for controlling one of the word lines and includes a second switch and a third switch. The second switch has a first terminal coupled to a second terminal of the first switch, and a second terminal coupled to the corresponding word line. The third switch has a first terminal coupled to the second terminal of the second switch, and a second terminal coupled to a second voltage.

The invention will become apparent from the following detailed description of the preferred but non-limiting embodiments. The following description is made with reference to the accompanying drawings.

DETAILED DESCRIPTION OF THE INVENTION

The invention provides a charge recycling method and a driving circuit and a low power memory using the same, wherein drivers in the driving circuit are respectively coupled to switches and the charge recycling method is adopted so that charges stored in one capacitor corresponding to the driver may be used in another one capacitor through a short-circuit loop, and the power consumption is reduced.

Figure 1A:
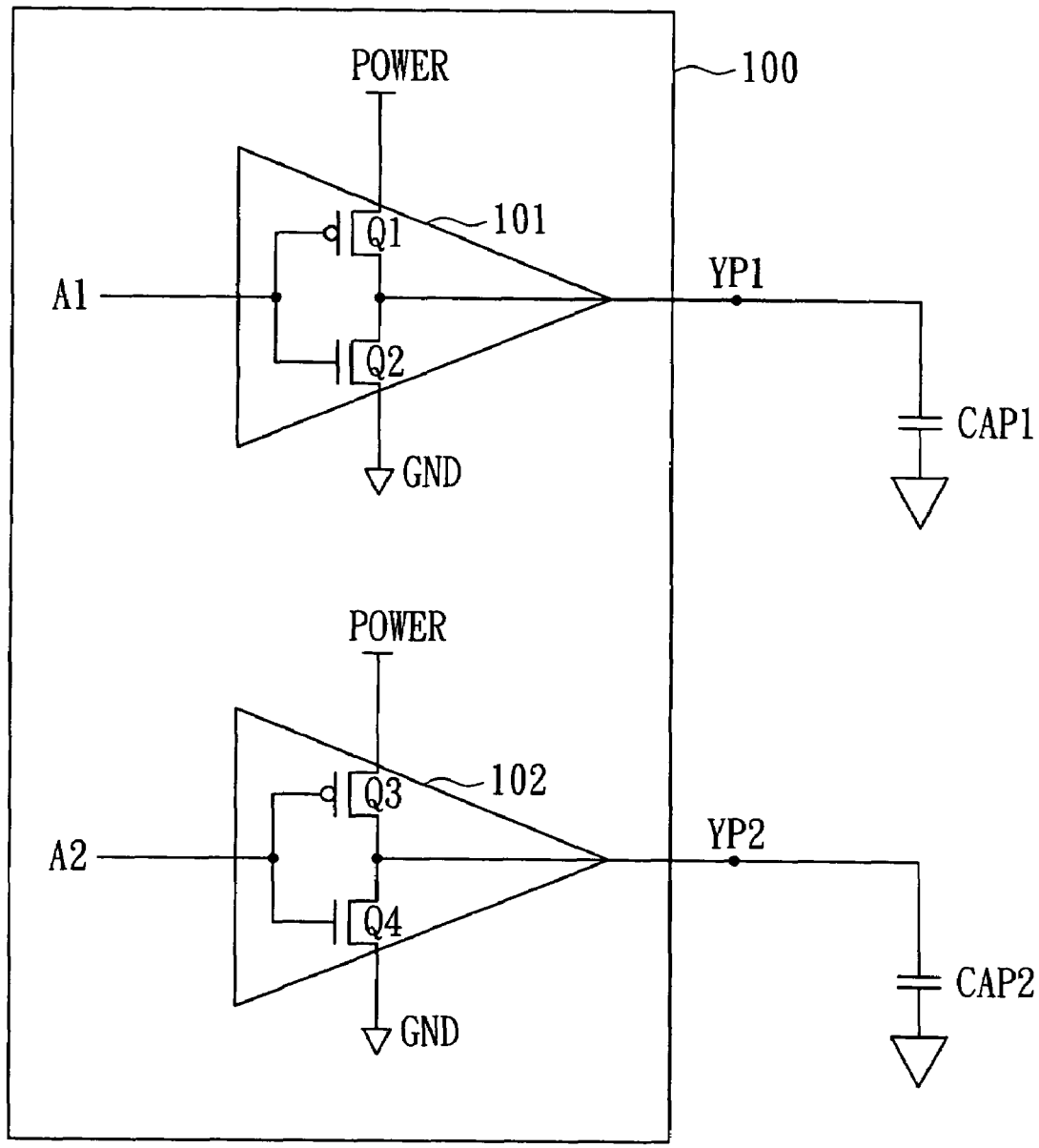
FIG. 1A (Prior Art) is a schematic illustration showing a Y pre-decode driving circuit of a conventional memory.
Figure 1B:
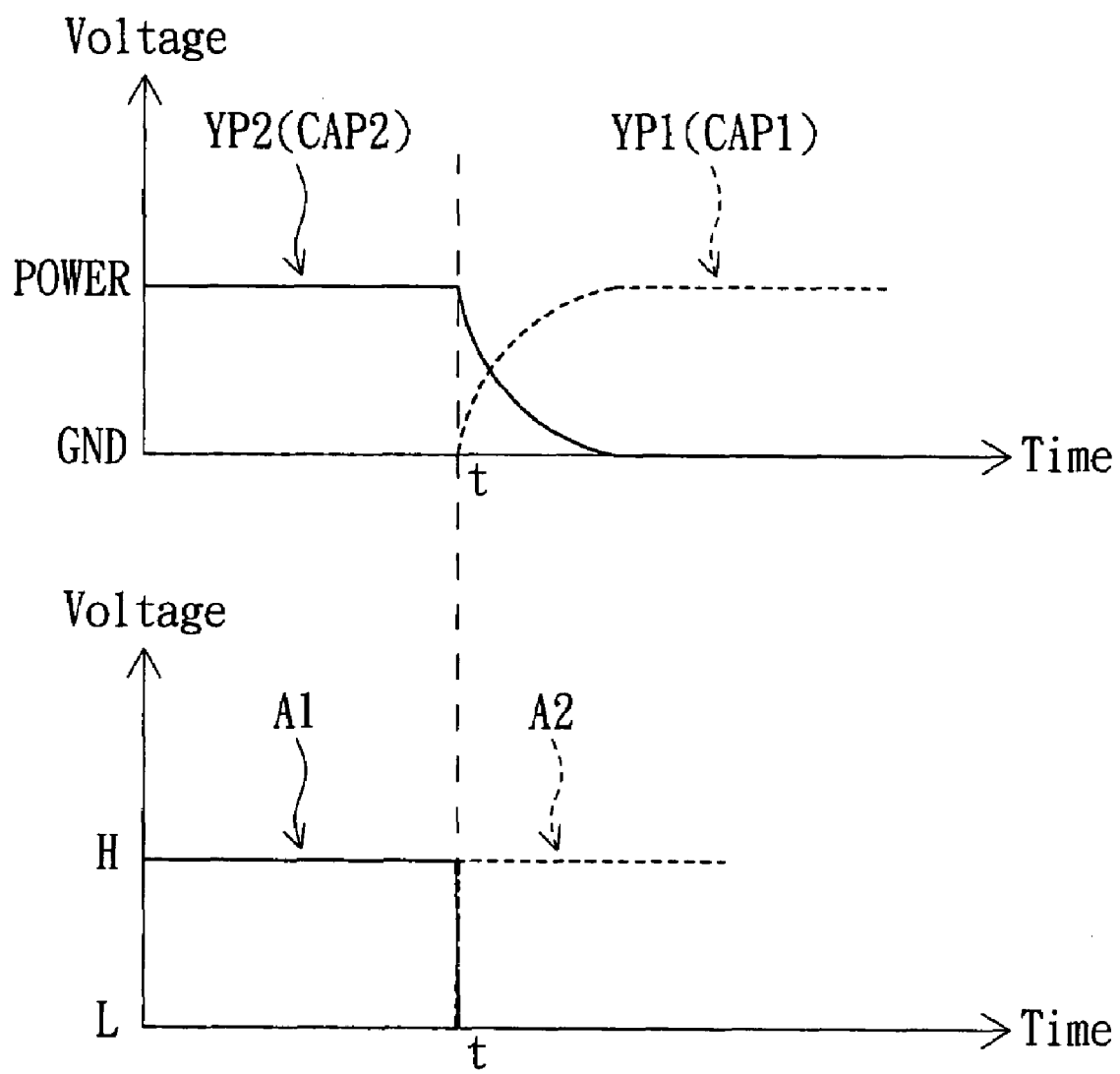
FIG. 1B (Prior Art) shows waveforms of time V.S. voltages of address select signals A1 and A2, output nodes YP1 and YP2 and parasitic capacitors CAP1 and CAP2 of the Y pre-decode driving circuit 100.
Figure 2A:
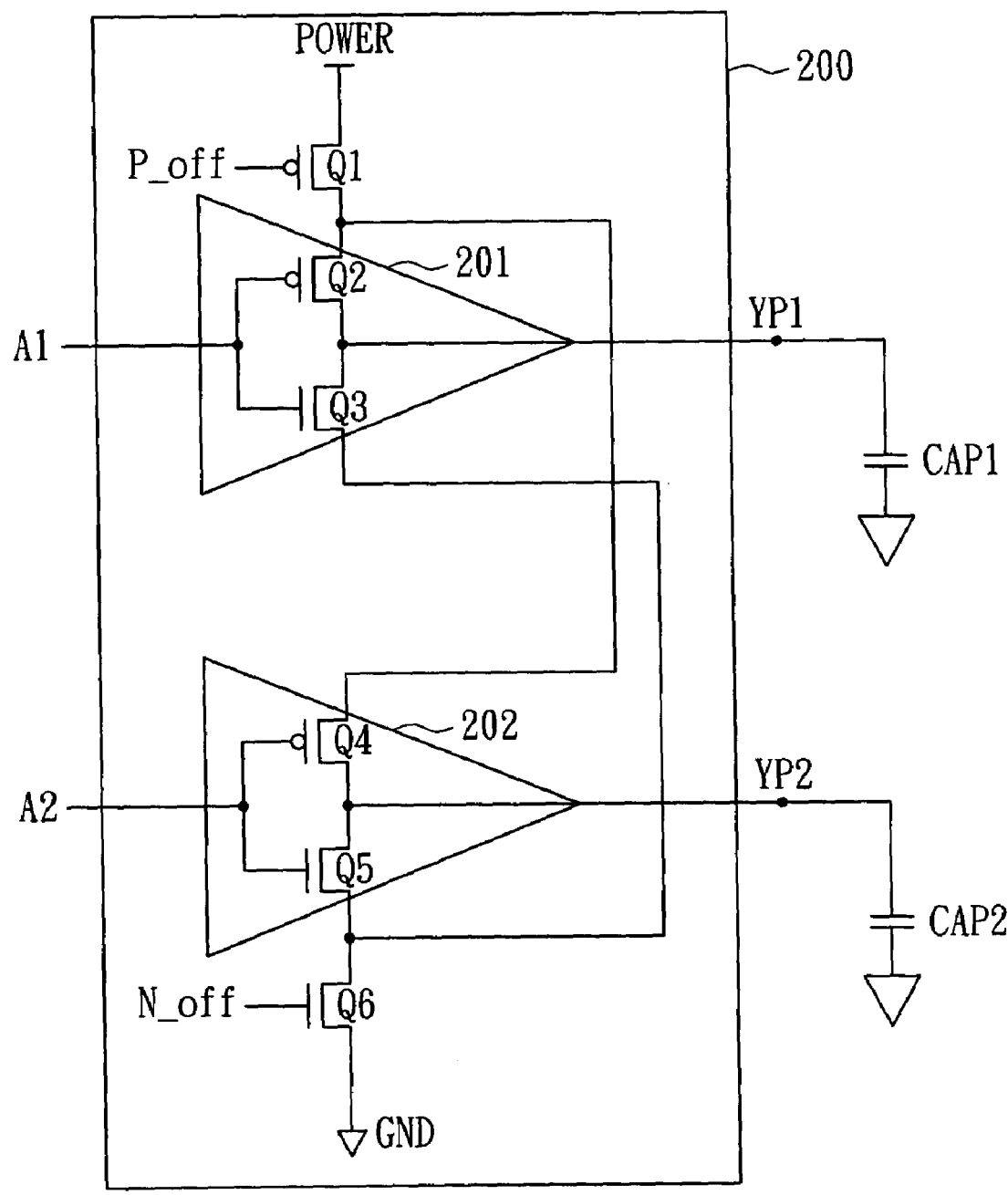
FIG. 2A is a schematic illustration showing a driving circuit according to a first embodiment of the invention.

FIG. 2A is a schematic illustration showing a driving circuit 200 according to a first embodiment of the invention. Referring to FIG. 2A, the driving circuit 200 includes a first switch Q1, a first driver 201, a second driver 202 and a sixth switch Q6. The first switch Q1 is a PMOS transistor. The first switch Q1 has a first terminal coupled to a designed voltage POWER, and the first switch Q1 is controlled by a first switch signal P_off. The first driver 201 includes a second switch Q2 which is the PMOS transistor, and a third switch Q3 which is an NMOS transistor. The second switch Q2 has a first terminal coupled to a second terminal of the first switch Q1, and a second terminal coupled to a first capacitor CAP1. The third switch Q3 has a first terminal coupled to the second terminal of the second switch Q2. The second switch Q2 and the third switch Q3 substantially form a CMOS inverter controlled by a first control signal A1. In addition, the first capacitor CAP1 may be, without limitation to, an actual capacitor, a parasitic capacitor generated by circuit elements in various circuits, or an equivalent capacitor of the circuit elements.

The second driver 202 includes a fourth switch Q4 which is the PMOS transistor, and a fifth switch Q5 which is the NMOS transistor. The fourth switch Q4 has a first terminal coupled to the second terminal of the first switch Q1, and a second terminal coupled to a second capacitor CAP2. The fifth switch Q5 has a first terminal coupled to the second terminal of the fourth switch Q4. The fourth switch Q4 and the fifth switch Q5 substantially form a CMOS inverter controlled by a second control signal A2. In addition, the second capacitor CAP2 may be, without limitation to, an actual capacitor, a parasitic capacitor generated by circuit elements in various circuits, or an equivalent capacitor of the circuit elements. The sixth switch Q6 is the NMOS transistor having a first terminal coupled to a second terminal of the third switch Q3 and a second terminal of the fifth switch Q5, and a second terminal coupled to a ground voltage GND. The sixth switch Q6 is controlled by a second switch signal N_off.

Figure 2B:
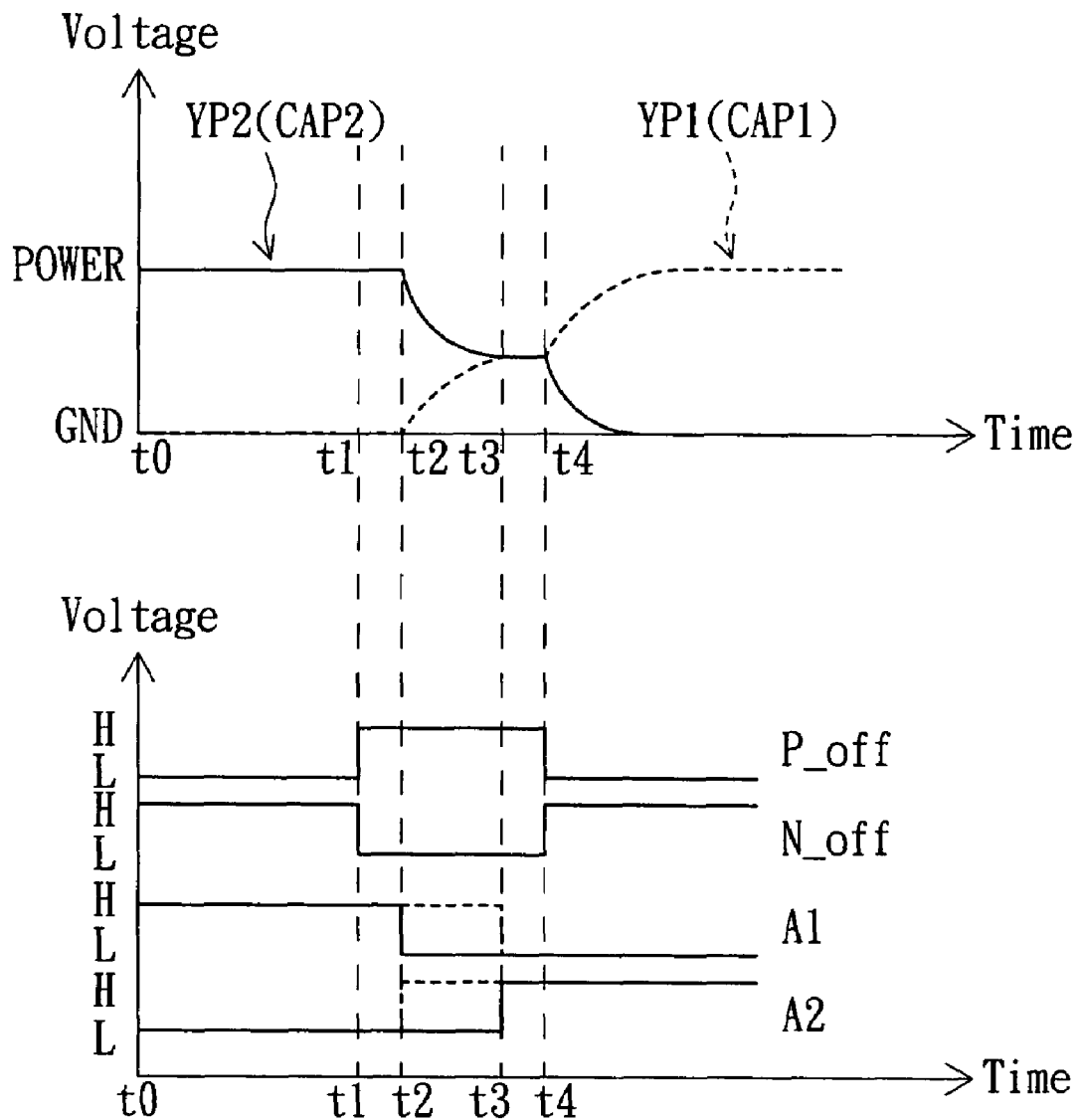
FIG. 2B shows waveforms of time V.S. voltages of switch signals P_off and N_off, control signals A1 and A2, output nodes YP1 and YP2 and capacitors CAP1 and CAP2 according to the first embodiment of the invention.

FIG. 2B shows waveforms of time V.S. voltages of switch signals P_off and N_off, control signals A1 and A2, output nodes YP1 and YP2 and capacitors CAP1 and CAP2 according to the first embodiment of the invention. In the time period from t0 to t1, the first switch Q1, the third switch Q3, the fourth switch Q4 and the sixth switch Q6 are turned on, and the second switch Q2 and the fifth switch Q5 are turned off so that a voltage level of the first capacitor CAP1 is the ground voltage GND and the second capacitor CAP2 is charged to the voltage level of the designed voltage POWER. Then, the first capacitor CAP1 is to be charged and the second capacitor CAP2 is to be discharged.

In the time period from t1 to t2, the first switch Q1 is turned off to isolate the designed voltage POWER and the sixth switch Q6 is turned off to isolate the ground voltage GND. In the time period from t2 to t3, the second switch Q2 is turned on and the third switch Q3 is turned off. Thus, a short-circuit loop between the first capacitor CAP1 and the second capacitor CAP2 is formed through the second switch Q2 and the fourth switch Q4. The charges stored in the second capacitor CAP2 flow to the first capacitor CAP1 through the short-circuit loop until the voltage level of the second terminal of the second switch Q2 is equal to the voltage level of the second terminal of the fourth switch Q4. In addition, in the time period from t2 to t3, the fourth switch Q4 may also be turned off and the fifth switch Q5 may also be turned on. Consequently, another short-circuit loop between the first capacitor CAP1 and the second capacitor CAP2 is formed through the third switch Q3 and the fifth switch Q5. The charges stored in the second capacitor CAP2 flow to the first capacitor CAP1 through the another short-circuit loop until the voltage level of the second terminal of the second switch Q2 is equal to the voltage level of the second terminal of the fourth switch Q4.

In the time period from t3 to t4, the second switch Q2 and the fifth switch Q5 are turned on and the third switch Q3 and the fourth switch Q4 are turned off. At this time, the voltage level of the second capacitor CAP2 and the voltage level of the first capacitor CAP1 are stably held. And driver signals are transited. After the time instant t4, the first switch Q1 and the sixth switch Q6 are turned on. Thus, the first capacitor CAP1 is charged through the first switch Q1 so that the voltage level of the first capacitor CAP1 approaches the designed voltage POWER more quickly. Meanwhile, the voltage level of the second capacitor CAP2 is discharged through the sixth switch Q6 and approaches the ground voltage GND.

In the driving circuit 200 according to the first embodiment, several switches are disposed between the first capacitor CAP1 and the second capacitor CAP2 to form the short-circuit loops so that the charges stored in one of the first capacitor CAP1 and the second capacitor CAP2 flow to the other one of the first capacitor CAP1 and the second capacitor CAP2 in a direction from a higher voltage level to a lower voltage level in the time period from t2 to t3. That is, the charges stored in the capacitor with the higher voltage level are recycled to charge the capacitor with the lower voltage level. Consequently, the power consumption is reduced. In addition, the front stage circuit in the driving circuit 200 may not be adapted to the continuously high voltage level or the continuously low voltage level. At this time, the driving circuit 200 can select one of two short-circuit loops to implement the charge recycling due to the existence of the first switch Q1 and the sixth switch Q6 and does not have to consider what the front stage circuit of the driving circuit 200 is.

Figure 3A:
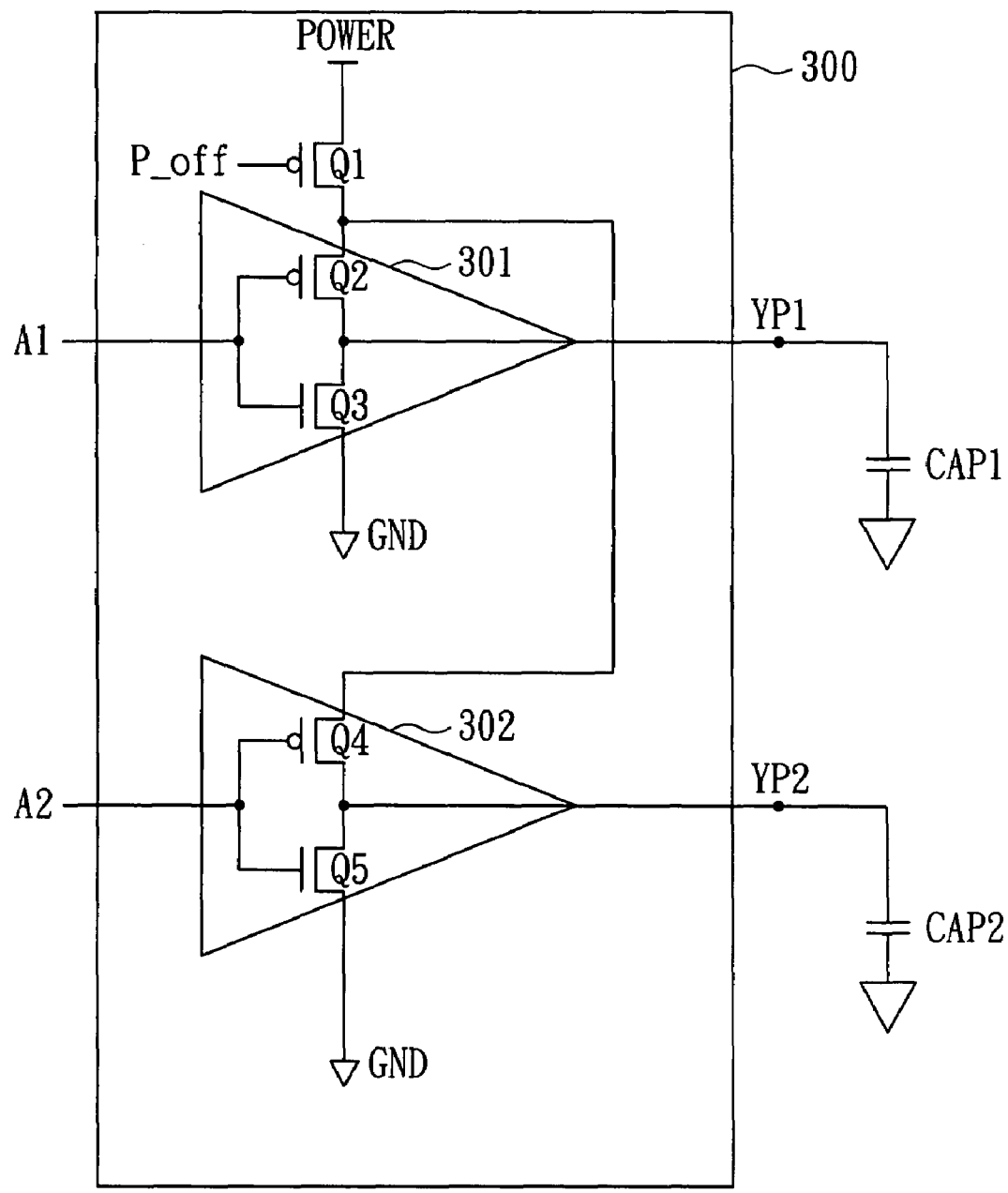
FIG. 3A is a schematic illustration showing a driving circuit according to a second embodiment of the invention.

However, if the front stage circuit of the driving circuit is a definite circuit and it is possible to know whether the driving circuit is adapted to the continuously high voltage level or the continuously low voltage level, then the driving circuit may be further simplified. FIG. 3A is a schematic illustration showing a driving circuit 300 according to a second embodiment of the invention. As shown in FIG. 3A, the front stage circuit of the driving circuit 300 is adapted to the continuously high voltage level. The driving circuit 300 includes a first switch Q1, a first driver 301 and a second driver 302. The first switch Q1 is the PMOS transistor and has a first terminal coupled to the designed voltage POWER, and the first switch Q1 is controlled by the switch signal P_off. The first driver 301 includes a second switch Q2 which is the PMOS transistor, and a third switch Q3 which is the NMOS transistor. The second switch Q2 and the third switch Q3 are connected in series. The second switch Q2 has a first terminal coupled to a second terminal of the first switch Q1, and a second terminal coupled to a first capacitor CAP1. The third switch Q3 has a second terminal coupled to the ground voltage GND. The second switch Q2 and the third switch Q3 substantially form a CMOS inverter controlled by the first control signal A1.

Figure 3B:
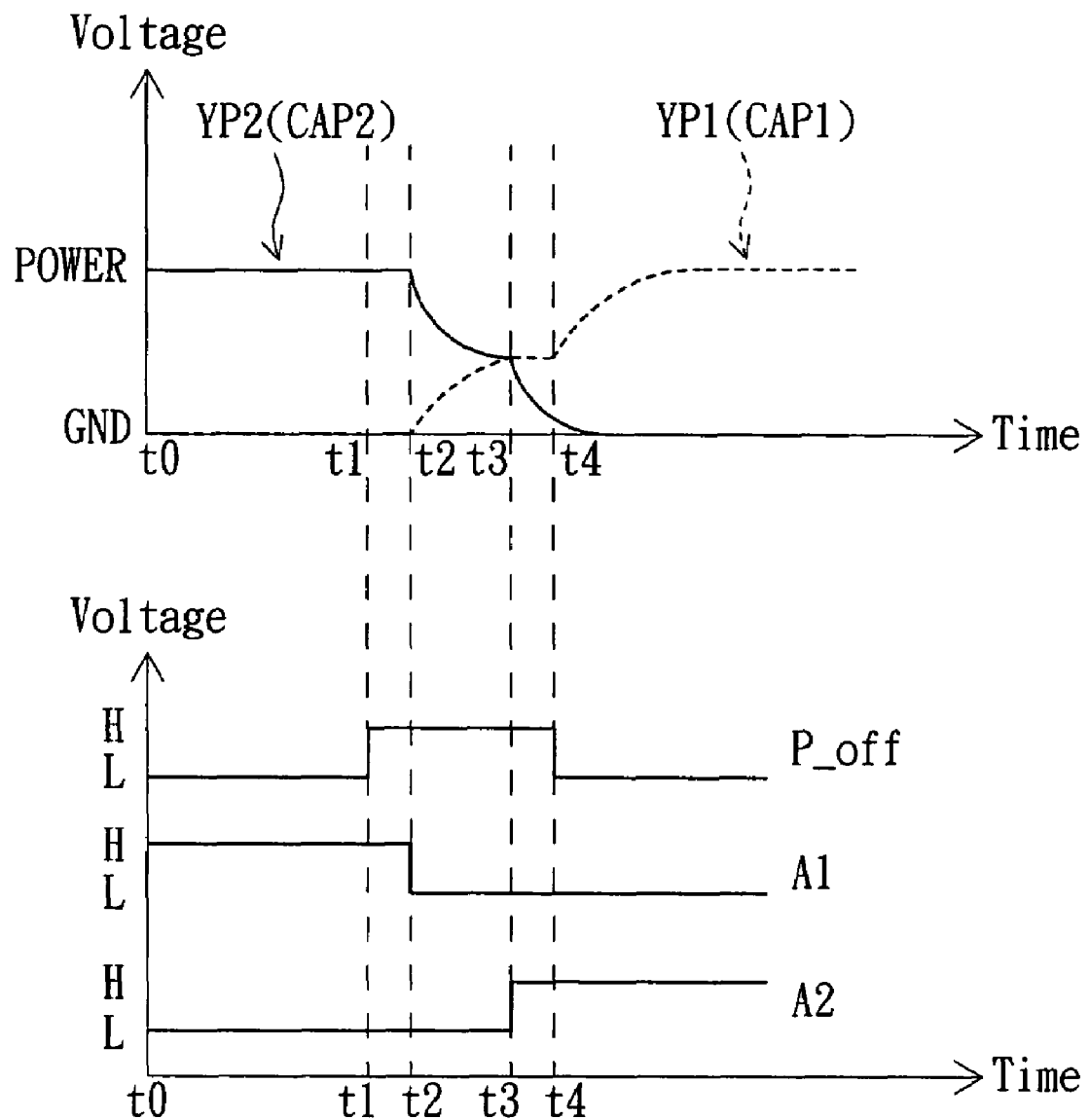
FIG. 3B shows waveforms of time V.S. voltages of the switch signal P_off, the control signals A1 and A2, the output nodes YP1 and YP2 and the capacitors CAP1 and CAP2 according to the second embodiment of the invention.

The second driver 302 includes a fourth switch Q4 which is the PMOS transistor, and a fifth switch Q5 which is the NMOS transistor. The fourth switch Q4 and the fifth switch Q5 are connected in series. The fourth switch Q4 has a first terminal coupled to the second terminal of the first switch Q1, and a second terminal coupled to a second capacitor CAP2. The second terminal of the fifth switch Q5 is coupled to the ground voltage GND. The fourth switch Q4 and the fifth switch Q5 substantially form a CMOS inverter controlled by the second control signal A2. In addition, each of the first capacitor CAP1 and the second capacitor CAP2 may be, without limitation to, an actual capacitor, a parasitic capacitor generated by circuit elements in various circuits, or an equivalent capacitor of the circuit elements. FIG. 3B shows waveforms of time V.S. voltages of the switch signal P_off, the control signals A1 and A2, the output nodes YP1 and YP2 and the capacitors CAP1 and CAP2 according to the second embodiment of the invention. The detailed operation principle of the driving circuit 300 according to the second embodiment is similar to the driving circuit 200 and has been described hereinabove in detail, so detailed descriptions hereof will be omitted.

Figure 4A:
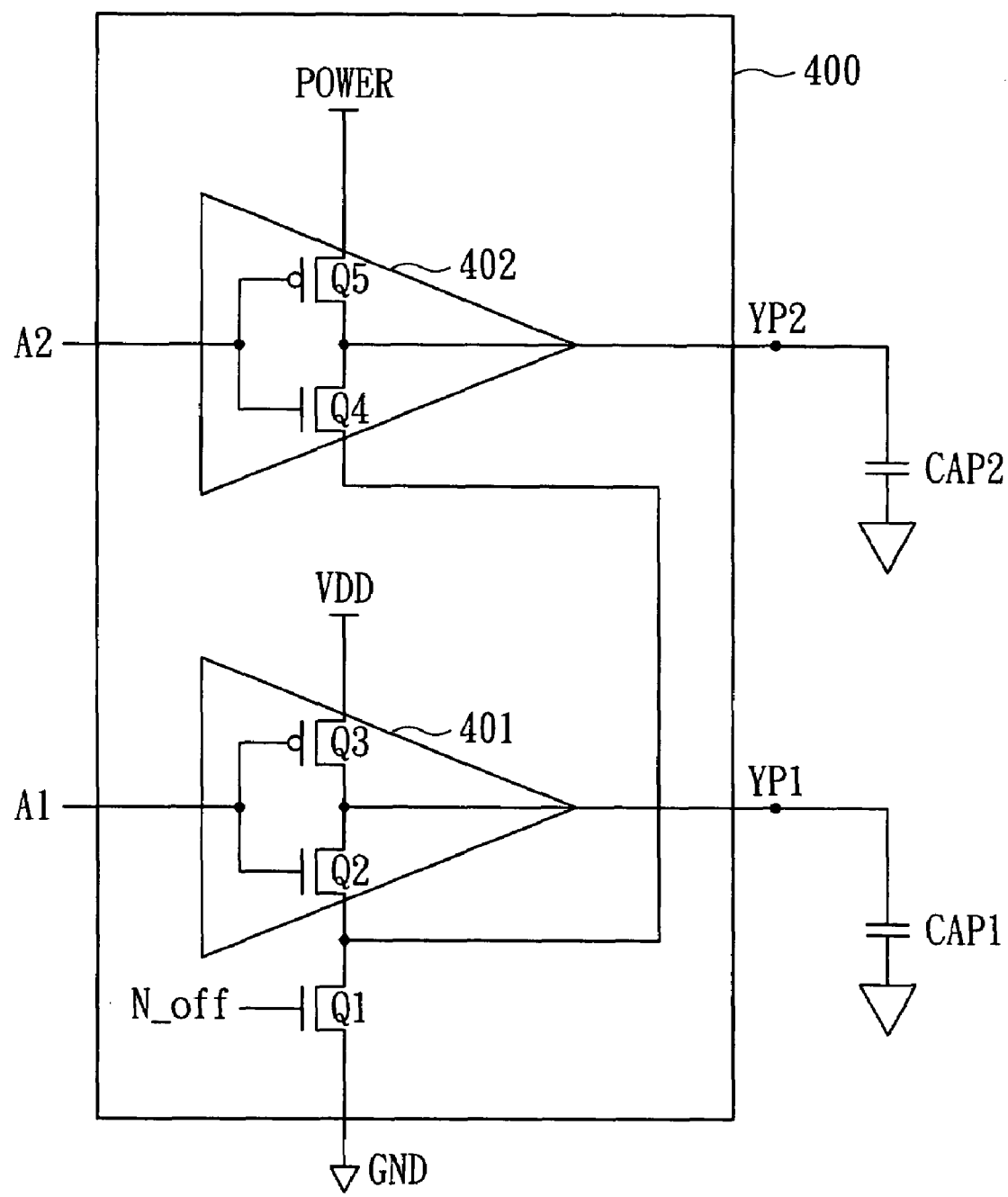
FIG. 4A is a schematic illustration showing a driving circuit according to a third embodiment of the invention.

If the front stage circuit of the driving circuit is adapted to the continuously low voltage level, the following descriptions will be made with reference to FIG. 4A. FIG. 4A is a schematic illustration showing a driving circuit 400 according to a third embodiment of the invention. Referring to FIG. 4A, the driving circuit 400 includes a first switch Q1, a first driver 401 and a second driver 402. The first switch Q1 is the NMOS transistor, which has a first terminal coupled to the ground voltage GND and is controlled by the switch signal N_off. The first driver 401 includes a second switch Q2 which is the NMOS transistor, and a third switch Q3 which is the PMOS transistor. The second switch Q2 has a first terminal coupled to a second terminal of the first switch Q1, and a second terminal coupled to a first capacitor CAP1. The third switch Q3 has a first terminal coupled to the second terminal of the second switch Q2, and a second terminal coupled to the operation voltage POWER. The second switch Q2 and the third switch Q3 substantially form a CMOS inverter controlled by the first control signal A1.

The second driver 402 includes a fourth switch Q4 which is the NMOS transistor, and a fifth switch Q5 which is the PMOS transistor. The fourth switch Q4 has a first terminal coupled to the second terminal of the first switch Q1, and a second terminal coupled to a second capacitor CAP2. The fifth switch Q5 has a first terminal coupled to the second terminal of the fourth switch Q4, and a second terminal coupled to the operation voltage POWER. The fourth switch Q4 and the fifth switch Q5 substantially form a CMOS inverter controlled by the second control signal A2. In addition, each of the first capacitor CAP1 and the second capacitor CAP2 may be, without limitation to, an actual capacitor, a parasitic capacitor generated by circuit elements in various circuits, or an equivalent capacitor of the circuit elements.

Figure 4B:
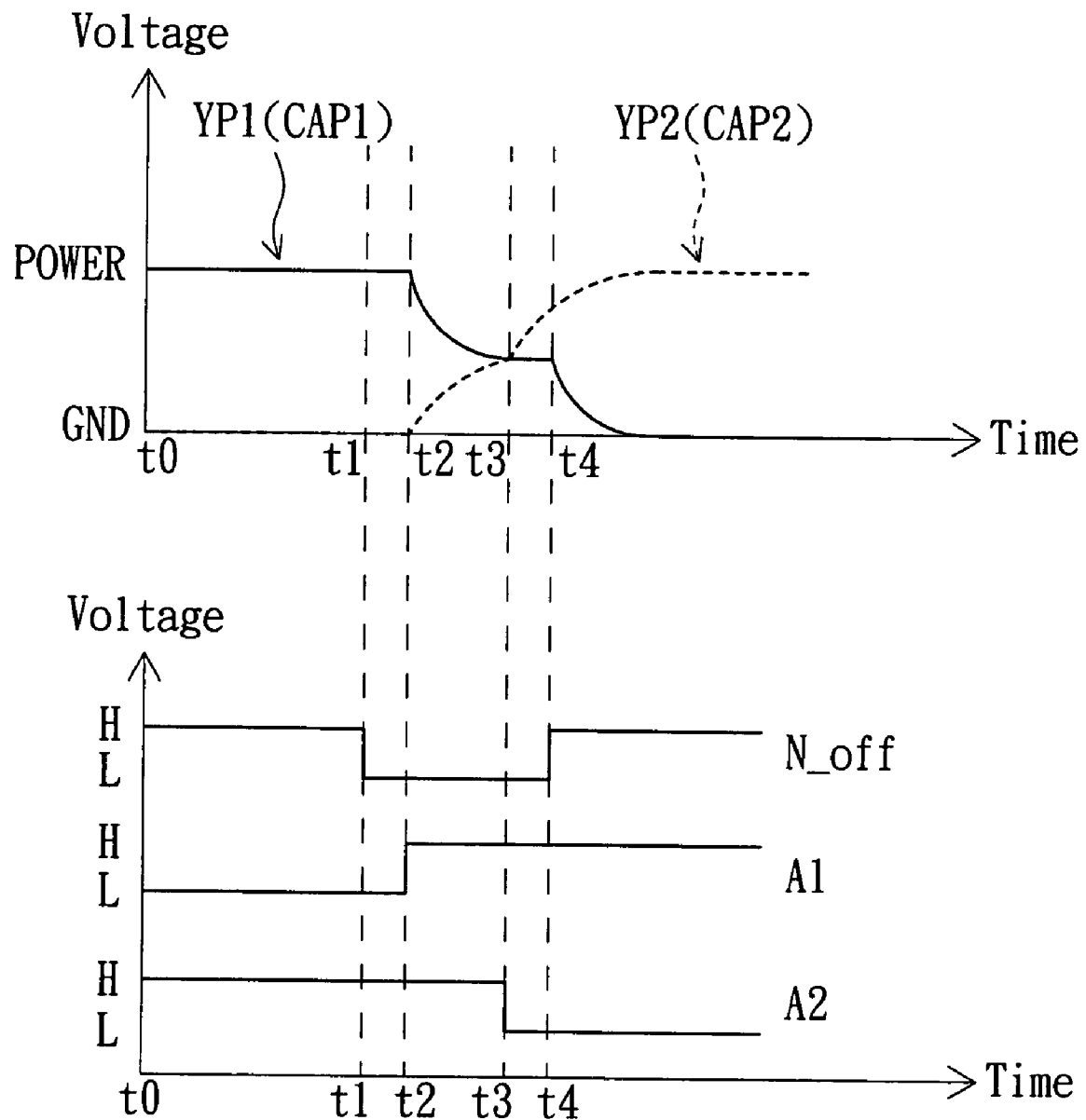
FIG. 4B shows waveforms of time V.S. voltages of the switch signal N_off, the control signals A1 and A2, the output nodes YP1 and YP2 and the capacitors CAP1 and CAP2 according to the third embodiment of the invention.

FIG. 4B shows waveforms of time V.S. voltages of the switch signal N_off, the control signals A1 and A2 and the output nodes YP1 and YP2 and the capacitors CAP1 and CAP2 according to the third embodiment of the invention. In the time period from t0 to t1, the first switch Q1, the third switch Q3 and the fourth switch Q4 are turned on, and the second switch Q2 and the fifth switch Q5 are turned off so that the first capacitor CAP1 is charged to the voltage level equal to the operation voltage POWER, and the voltage level of the second capacitor CAP2 is equal to the ground voltage GND. Thereafter, the second capacitor CAP2 is to be charged, and the first capacitor CAP1 has to be discharged.

In the time period from t1 to t2, the first switch Q1 is turned off to isolate the ground voltage GND. In the time period from t2 to t3, the second switch Q2 is turned on and the third switch Q3 is turned off. Thus, a short-circuit loop between the first capacitor CAP1 and the second capacitor CAP2 is formed through the second switch Q2 and the fourth switch Q4. The charges stored in the first capacitor CAP1 flow to the second capacitor CAP2 through the short-circuit loop until the voltage level of the second terminal of the second switch Q2 is equal to the voltage level of the second terminal of the fourth switch Q4.

In the time period from t3 to t4, the fifth switch Q5 is turned on and the fourth switch Q4 is turned off. At this time, the voltage level of the second capacitor CAP2 rapidly approaches the designed voltage POWER, and the voltage level of the first capacitor CAP1 is stably held. After the time instant t4, the first switch Q1 is turned on. Thus, the first capacitor CAP1 discharges more rapidly through the first switch Q1, and the voltage level of the first capacitor CAP1 approaches the ground voltage GND. Meanwhile, the voltage level of the second capacitor CAP2 further approaches the designed voltage POWER.

The driving circuit 400 according to the third embodiment recycles the charges using the short-circuit loop formed by the second switch Q2 and the fourth switch Q4, so that the power consumption is reduced.

Figure 5:
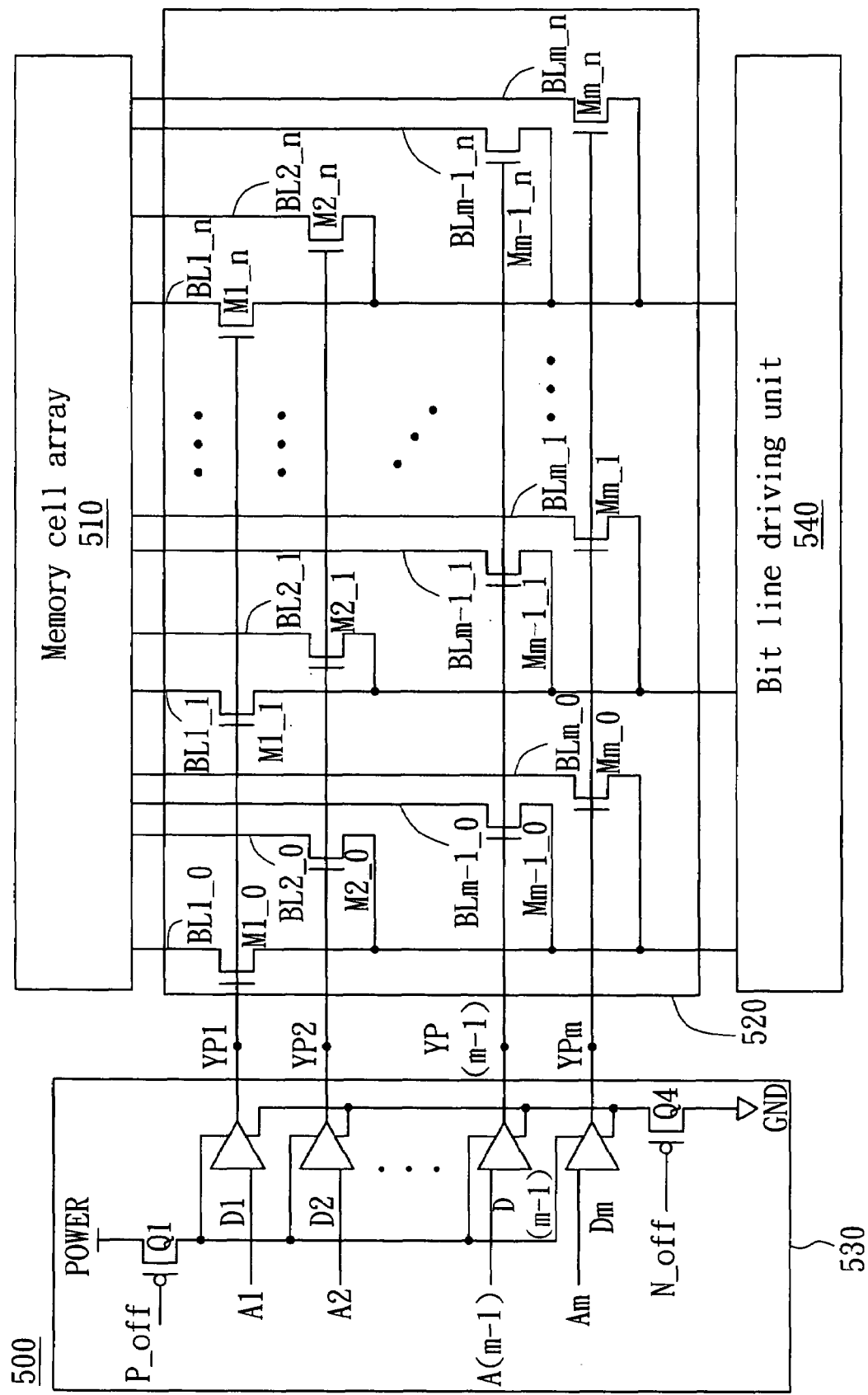
FIG. 5 is a schematic illustration showing a low power memory according to a fourth embodiment of the invention.

In addition, the invention also discloses a low power memory, which reduces the power consumption and shortens the charging time using the driving circuit mentioned above in the Y pre-decode driving circuit or the X pre-decode driving circuit. FIG. 5 is a schematic illustration showing a low power memory 500 according to a fourth embodiment of the invention. Referring to FIG. 5, the low power memory 500 includes multiple bit lines BLx_y, a memory cell array 510, a Y multiplexer 520, a Y pre-decode driving circuit 530 and a bit line driving unit 540. The memory cell array 510 is coupled to the bit lines BLx_y. The Y multiplexer 520 includes multiple select transistors Mx_y arranged in an array. The first terminals of the select transistors Mx_y are respectively coupled to the bit lines BLx_y, wherein x is a positive integer ranged from 1 to m, and y is an integer ranged from 0 to n.

The Y pre-decode driving circuit 530 includes a first switch Q1, a plurality of pre-decode drivers D1 to Dm and a fourth switch Q4. The first switch Q1 is the PMOS transistor and has a first terminal coupled to the designed voltage POWER. The pre-decode drivers D1 to Dm respectively have output signals YP1 to YPm, and are respectively controlled by address select signals A1 to Am and each of the pre-decode drivers D1 to Dm controls one row of select transistors in the Y multiplexer 520. Each row of the select transistors substantially generates corresponding parasitic capacitors CAP1 to CAPm. Each of the pre-decode drivers D1 to Dm substantially includes a CMOS phase inverter. The actual circuit of each of the pre-decode drivers D1 to Dm is the same as the driving circuit 200 disclosed in the first embodiment, so detailed descriptions thereof will be omitted. The fourth switch Q4 is the NMOS transistor and has a first terminal coupled to the second terminals of the third switches Q3, and a second terminal coupled to the ground voltage GND. The bit line driving unit 540 is coupled to the second terminals of the select transistors M to select the desired bit line for the low power memory 500 in cooperation with the pre-decode drivers D1 to Dm.

The low power memory 500 according to the fourth embodiment adopts the charge recycling method in the Y pre-decode driving circuit 530. If the low power memory selects the desired bit line according to the address select signal, the corresponding parasitic capacitor is charged to the designed voltage POWER. When the low power memory 500 wants to select the next bit line, the parasitic capacitor corresponding to the next bit line may be rapidly charged according to the charge recycling method so that the power consumption is reduced. The charge recycling mechanism has been described in the first embodiment in detail, so detailed descriptions thereof will be omitted.

Figure 6:
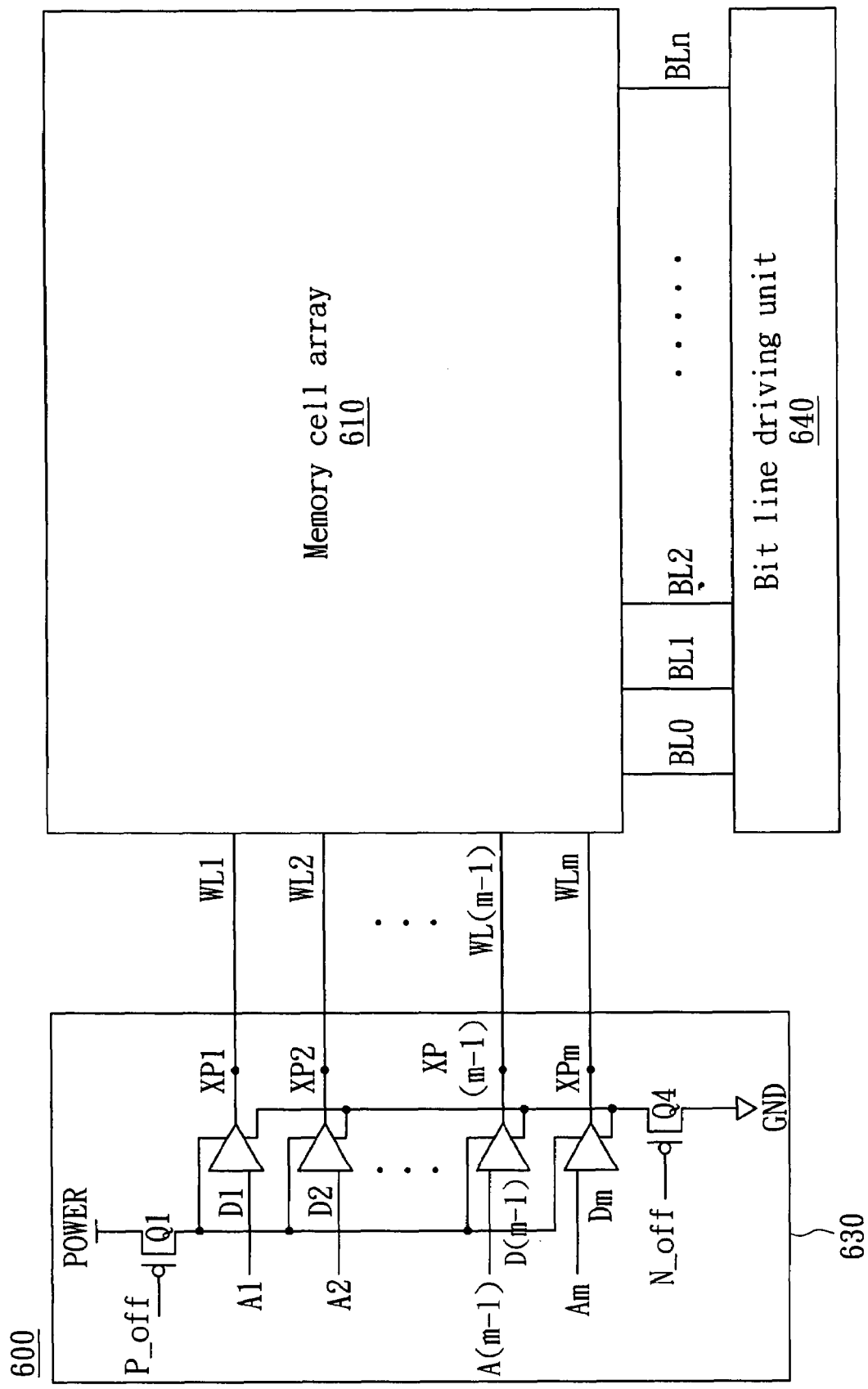
FIG. 6 is a schematic illustration showing a low power memory according to a fifth embodiment of the invention.

FIG. 6 is a schematic illustration showing a low power memory 600 according to a fifth embodiment of the invention. The low power memory 600 adopts the charge recycling method in the X decoder 630 and selects the desired word line. The low power memory 600 includes multiple word lines WL1 to WLm, multiple bit lines BL0 to BLn, a memory cell array 610, an X decoder 630 and a bit line driving unit 640. The memory cell array 610 is coupled with the word lines WL1 to WLm and the bit lines BL0 to BLn.

The X decoder 630 includes a first switch Q1, multiple pre-decode drivers D1 to Dm and a fourth switch Q4. The first switch Q1 is the PMOS transistor having a first terminal coupled to the designed voltage POWER. The pre-decode drivers D1 to Dm are respectively controlled by the address select signals A1 to An, and each of the pre-decode drivers D1 to Dn controls one of the word lines WL1 to WLm. Each of the pre-decode drivers D1 to Dm has an output node XP1 to XPm. Each of the pre-decode drivers D1 to Dm substantially includes a CMOS inverter. The fourth switch Q4 is the NMOS transistor and has a first terminal coupled to the second terminals of the third switches Q3, and a second terminal coupled to the ground voltage GND. The bit line driving unit 640 is coupled to memory cell array 610 and selects the desired word line for the low power memory 600. The actual operation principle of the low power memory 600 has been described in the driving circuit 200 of the first embodiment in detail, so detailed descriptions thereof will be omitted.

The charge recycling method and the driving circuit and the low power memory using the same according to the first to fifth embodiments of the invention have the following features. First, the drivers in the driving circuit are respectively coupled to a switch or multiple switches so that the charges stored in the capacitor corresponding to one driver can be reused by another capacitor corresponding to another driver through a short-circuit loop when the charge recycling method is adopted. Thus, the power consumption can be reduced, the charging time may be shortened, and the power noise can be reduced. In addition, the charge recycling method and the driving circuit according to the invention are not restricted to the application to the memory, and may also be applied to any other circuit with the large capacitance to reduce the power consumption.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A pre-decode driving circuit for a memory, comprising:
   first and second driving units, driven by a first voltage and a second voltage when enabled by a recycling circuit connected to at least one of the first voltage and the second voltage; and
   the recycling circuit and the first and the second driving units recycling charges in a first load corresponding to the first driving unit to a second load corresponding to the second driving unit.

2. The pre-decode driving circuit according to claim 1, wherein the recycling circuit includes:
   a first isolation switch for isolating the driving units from the first voltage; and
   a short-circuit loop, the short-circuit loop and the first and the second driving units recycling charges between the first load and the second load when the first driving unit is isolated from the first voltage.

3. The pre-decode driving circuit according to claim 2, wherein the recycling circuit further includes:
a second isolation switch for isolating the driving units from the second voltage;
wherein the short-circuit loop and the first and the second driving units recycle charges between the first load and the second load when the second driving unit is isolated from the second voltage.

4. The pre-decode driving circuit according to claim 3, wherein the first isolation switch includes a first switch having a first terminal coupled to the first voltage;
the first driving unit comprises:
a second switch having a first terminal coupled to a second terminal of the first switch, and a second terminal coupled to the first load; and
a third switch having a first terminal coupled to the second terminal of the second switch, and a second terminal coupled to the second voltage; and
the second driving unit comprises:
a fourth switch having a first terminal coupled to the second terminal of the first switch, and a second terminal coupled to the second load; and
a fifth switch having a first terminal coupled to the second terminal of the fourth switch, and a second terminal coupled to the second voltage;
the first switch, the third switch and the fourth switch are turned on and the second switch and the fifth switch are turned off so that a voltage level of the first load is the second voltage and a voltage level of the second load is the first voltage;
the first switch is turned off to isolate the first voltage; and
the second switch is turned on and the third switch is turned off so that charges stored in one of the first load and the second load flow to the other one of the first load and the second load in a direction from a higher voltage level to a lower voltage level until a voltage level of the second terminal of the second switch is equal to a voltage level of the second terminal of the fourth switch.

5. The pre-decode circuit according to claim 4, wherein the fourth switch is turned off and the fifth switch is turned on so that the voltage level of the second load approaches the second voltage.

6. The pre-decode driving circuit according to claim 5, wherein the first switch is turned on so that the voltage level of the first load approaches the first voltage.

7. The pre-decode driving circuit according to claim 6, wherein the second isolation switch further comprising:
a sixth switch having a first terminal coupled to the second terminal of the third switch and the second terminal of the fifth switch, and a second terminal coupled to the second voltage.

8. The pre-decode driving circuit according to claim 7, wherein the sixth switch is turned off to isolate the second voltage.

9. The pre-decode driving circuit according to claim 8, wherein the fourth switch is turned off and the fifth switch is turned on so that charges stored in one of the first load and the second load flow to the other one of the first load and the second load in the direction from the higher voltage level to the lower voltage level until the voltage level of the second terminal of the second switch is equal to the voltage level of the second terminal of the fourth switch.

10. The pre-decode driving circuit according to claim 9, wherein the sixth switch is turned on so that the voltage level of the second load approaches the second voltage.

11. The pre-decode driving circuit according to claim 1, wherein the first switch, the second switch and the fourth switch are PMOS transistors, the third switch and the fifth switch are NMOS transistors, the first voltage is a designed voltage, and the second voltage is a ground voltage.

12. The pre-decode driving circuit according to claim 1, wherein the first switch, the second switch and the fourth switch are NMOS transistors, the third switch and the fifth switch are PMOS transistors, the first voltage is a ground voltage, and the second voltage is a designed voltage.

13. The pre-decode driving circuit according to claim 7, wherein the first switch, the second switch and the fourth switch are PMOS transistors, the third switch, the fifth switch and the sixth switch are NMOS transistors, the first voltage is a designed voltage, and the second voltage is a ground voltage.

14. A memory, comprising:
a memory cell array containing a plurality of bit lines and word lines;
a multiplexer having a plurality of rows of select transistors; and
a pre-decode driving circuit, which comprises:
a plurality of driving units, respectively corresponding to the rows of the select transistors and being driven by a first voltage and a second voltage when enabled by a recycling circuit connected to at least one of the first voltage and the second voltage; and
the recycling circuit and first and second driving units recycling charges in a first load corresponding to the first driving unit back to a second load corresponding to the second driving unit.

15. The memory according to claim 14, wherein the recycling circuit includes:
a first isolation switch for isolating the driving units from the first voltage; and
a short-circuit loop, the short-circuit loop and the first and the second driving units recycling charges between the first load and the second load when the first driving unit is isolated from the first voltage.

16. The memory according to claim 15, wherein the recycling circuit further includes:
a second isolation switch for isolating the driving units from the second voltage;
wherein the short-circuit loop and the first and the second driving units recycle charges between the first load and the second load when the second driving unit is isolated from the second voltage.

17. The memory according to claim 16, wherein
the first isolation switch includes a first switch having a first terminal coupled to the first voltage; and
each of the driving units, controlling one row of the select transistors, first terminals of the select transistors being respectively coupled to the bit lines, each of the driving unit comprising:
a second switch having a first terminal coupled to a second terminal of the first switch, and a second terminal coupled to the row of the select transistors; and
a third switch having a first terminal coupled to the second terminal of the second switch, and a second terminal coupled to the second voltage;
wherein the short-circuit loop is formed by at least two of the second and the third switches of the first driving unit and the second and the third switches of the second driving unit;
the first switch, the third switch of the first driving unit and the second switch of the second driving unit are turned on, the second switch of the first driving unit and the third switch of the second driving unit are turned off so that a voltage level of the first load is the second voltage and a voltage level of the second load is the first voltage; the first switch is turned off to isolate the first voltage.

18. The memory according to claim 17, wherein the third switch of the first driving unit is turned off, then the second switch of the first driving unit is turned on so that charges stored in one of the second load and the first load flow to the other one of the second load and the first load in a direction from a higher voltage level to a lower voltage level until a voltage level of the second terminal of the second switch of the first driving unit is equal to a voltage level of the second terminal of the second switch of the second driving unit.

19. The memory according to claim 18, wherein the second switch of the first driving unit and the third switch of the second driving unit are turned on and the third switch of the first driving unit and the second switch of the second driving unit are turned off so that the voltage level of the first load and the voltage level of the second load are stably held.

20. The memory according to claim 19, wherein the first switch is turned on so that the voltage level of the first load approaches the first voltage.

21. The memory according to claim 20, wherein the second isolation switch further comprises:
a fourth switch having a first terminal coupled to the second terminal of the third switch, and a second terminal coupled to the second voltage.

22. The memory according to claim 21, wherein the fourth switch is turned off to isolate the second voltage.

23. The memory according to claim 22, wherein the second switch of the second driving unit is turned off and the third switch of the second driving unit is turned on so that charges stored in one of the second load and the first load flow to the other one of the second load and the first load in the direction from the higher voltage level to the lower voltage level until the voltage level of the second terminal of the second switch of the first driving unit is equal to the voltage level of the second terminal of the second switch of the second driving unit.

24. The memory according to claim 23, wherein the fourth switch is turned on so that a voltage level of the first load approaches the second voltage.

25. The memory according to claim 17, wherein the first switch, the second switch of the first driving unit and the second switch of the second driving unit are PMOS transistors, the third switch of the first driving unit and the third switch of the second driving unit are NMOS transistors, the first voltage is a designed voltage, and the second voltage is a ground voltage.

26. The memory according to claim 17, wherein the first switch, the second switch of the first driving unit and the second switch of the second driving unit are NMOS transistors, the third switch of the first driving unit and the third switch of the second driving unit are PMOS transistors, the first voltage is a ground voltage, and the second voltage is a designed voltage.

27. The memory according to claim 21, wherein the first switch, the second switch of the first driving unit and the second switch of the second driving unit are PMOS transistors, the third switch of the first driving unit, the third switch of the second driving unit and the fourth switch are NMOS transistors, the first voltage is a designed voltage, and the second voltage is a ground voltage.

28. A pre-decode driving method applied in a pre-decode driving circuit for a memory having a first load and a second load, the method comprising the steps of:
charging the first load to a high voltage by a first driving unit of the pre-decoding driving circuit;
turning off charging the first load by a recycling circuit of the pre-decode driving circuit;
sharing charges from the first load to the second load after said turning off charging the first load, by the recycling circuit, the first driving unit and a second driving unit of the pre-decode driving circuit; and
charging the second load to the high voltage by the second driving unit and the recycling circuit of the pre-decoding driving circuit.

29. The pre-decode driving method of claim 28, further comprising step of:
discharging the first load and charging the second load simultaneously by the first and second driving units of the pre-decoding driving circuit.

30. The pre-decode driving method of claim 28, further comprising step of:
discharging the first load before said charging the second load, by the first driving unit of the pre-decoding driving circuit.

31. The pre-decode driving method of claim 28, further comprising step of:
discharging the first load after said charging the second load, by the first driving unit of the pre-decoding driving circuit.

* * * * *